United States Patent
Sinha et al.

(10) Patent No.: US 9,276,083 B2
(45) Date of Patent: Mar. 1, 2016

(54) MEMORY ELEMENTS WITH STACKED PULL-UP DEVICES

(71) Applicant: Altera Corporation, San Jose, CA (US)

(72) Inventors: Shankar Sinha, San Jose, CA (US); Brian Wong, Mountain View, CA (US); Shih-Lin Lee, San Jose, CA (US); Wei Zhang, San Jose, CA (US); Abhishek Bankey Behari Sharma, San Jose, CA (US)

(73) Assignee: Altera Corporation, San Jose ( * ) Notice: Subject to any disclaimer, the term of this patent is extended or adjusted under 35 U.S.C. 154(b) by 48 days.

(21) Appl. No.: 13/715,442

(22) Filed: Dec. 14, 2012

(65) Prior Publication Data
US 2014/0169074 A1    Jun. 19, 2014

(51) Int. Cl.
| H01L 29/66 | (2006.01) |
| G11C 11/412 | (2006.01) |
| H01L 27/02 | (2006.01) |
| H01L 27/11 | (2006.01) |

(52) U.S. Cl.
CPC ........ *H01L 29/66477* (2013.01); *G11C 11/412* (2013.01); *G11C 11/4125* (2013.01); *H01L 27/0207* (2013.01); *H01L 27/1104* (2013.01)

(58) Field of Classification Search
USPC ........................ 365/148, 205, 226, 72, 189.02
See application file for complete search history.

(56) References Cited

U.S. PATENT DOCUMENTS

| 5,128,731 | A | 7/1992 | Lien et al. |
| 5,145,799 | A | 9/1992 | Rodder |
| 5,324,961 | A | 6/1994 | Rodder |
| 7,449,753 | B2 | 11/2008 | Wang et al. |
| 7,656,702 | B2* | 2/2010 | Wijeratne ............. G11C 11/412 365/154 |
| 7,876,602 | B2* | 1/2011 | Lawrence .......... G11C 11/4125 365/154 |
| 7,920,410 | B1 | 4/2011 | Lee et al. |
| 8,081,502 | B1 | 12/2011 | Rahim et al. |
| 8,482,963 | B1* | 7/2013 | Liu ....................... G11C 11/412 365/154 |
| 2001/0038552 | A1* | 11/2001 | Ishimaru .............. G11C 11/412 365/181 |
| 2003/0107913 | A1* | 6/2003 | Nii ...................... G11C 11/4125 365/154 |
| 2006/0239094 | A1* | 10/2006 | Maki ........................ G11C 7/06 365/63 |
| 2007/0236985 | A1* | 10/2007 | Edahiro et al. ................ 365/154 |
| 2008/0247251 | A1* | 10/2008 | Genevaux ................ G11C 7/08 365/210.11 |
| 2009/0213641 | A1* | 8/2009 | Park ..................... G11C 11/413 365/154 |
| 2012/0228714 | A1 | 9/2012 | Lim et al. |

OTHER PUBLICATIONS

Liu et al., U.S. Appl. No. 12/629,831, filed Dec. 2, 2009.
Liu et al., U.S. Appl. No. 12/874,152, filed Sep. 1, 2010.

* cited by examiner

*Primary Examiner* — Shawki S Ismail
*Assistant Examiner* — Muhammad S Islam
(74) *Attorney, Agent, or Firm* — Treyz Law Group; Jason Tsai (57) ABSTRACT

Integrated circuits with memory cells are provided. A memory cell may include first and second cross-coupled inverting circuits configured to store a single data bit. The first inverting circuit may have an output serving as a first data storage node for the memory cell, whereas the second inverting circuit may have an output serving as a second data storage node for the memory cell. Access transistors may be coupled between the first and second data storage nodes and corresponding data lines. Each of the first and second inverting circuit may have a pull-down transistor and at least two pull-up transistors stacked in series. The pull-down transistors may have body terminals that are reverse biased to help reduce leakage current through the first and second inverting circuits. The memory cell may be formed using a narrower two-gate configuration or a wider four-gate configuration.

19 Claims, 9 Drawing Sheets

000
MEMORY ELEMENTS WITH STACKED PULL-UP DEVICES

BACKGROUND

This relates to integrated circuits with memory and, more particularly, to volatile memory elements.

Integrated circuits often contain volatile memory elements. A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. In programmable logic device integrated circuits, SRAM cells may serve as configuration random access memory (CRAM) cells. Programmable logic devices are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically based on cross-coupled inverters (latches). In each memory element, the cross-coupled inverters are connected to an address transistor that is turned on when data is being read from or written into the memory element. When no data is being read from or written into the memory element, the address transistor is turned off to isolate the memory element. Cross-coupled inverters and address transistors can be formed from complementary metal-oxide-semiconductor (CMOS) transistors such as n-channel metal-oxide-semiconductor (NMOS) and p-channel metal-oxide-semiconductor (PMOS) transistors.

As semiconductor technology scales towards smaller sizes, lower power supply voltages may be used to power integrated circuits. Lower power supply voltages and smaller devices may lead to decreased read and write margins for volatile memory elements. This can pose challenges for reliable device operation.

SUMMARY

Integrated circuits with memory cells are provided. Integrated circuits may include control circuitry that controls a memory cell array. The control circuitry may include circuitry such as addressing circuitry, data register circuitry, and read/write circuitry.

The memory cell array may include groups of memory cells arranged in rows and columns. Each memory cell may have a bistable storage portion that includes at least first and second cross-coupled inverting circuits. Each inverting circuit may include a plurality of stacked pull-up transistors (e.g., p-channel transistors) and a pull-down transistor (e.g., an n-channel transistor) coupled in series between first and second power supply lines. The pull-up transistors and the pull-down transistor in the first inverting circuit may have gate terminals that are shorted to one another to serve as an input for the first inverting circuit, whereas the pull-up transistors and the pull-down transistor in the second inverting circuit may have gate terminals that are shorted to one another to serve as an input for the second inverting circuit. The pull-down transistors may have body terminals that receive a voltage that reverse biases the body terminals of the pull-down transistor so as to reduce leakage current through the first and second inverting circuits.

The first inverting circuit may have an output that is coupled to the input of the second inverting circuit and that serves as a first data storage node for the memory cell. The second inverting circuit may have an output that is coupled to the input of the first inverting circuit and that serves as a second data storage node for the memory cell. Access transistors (sometimes referred to as pass gates) may be coupled to the first and second data storage nodes and may be used to load data into and read data from the memory cell.

A memory element formed using this arrangement may exhibit soft error upset (SEU) immunity. For example, consider a scenario in which the first data storage node receives a random radiation strike that results in a temporary voltage perturbation at the first data storage node. The pull-up transistors in the second inverting circuit may receive the temporary voltage perturbation at their gate terminals.

In response to receiving the radiation strike, the pull-up transistors in the first inverting circuit may restore the first data storage node to its original level by eliminating the temporary voltage perturbation by charging the first data storage node to a positive power supply level. The pull-down transistor in the second inverting circuit may also be used to hold a low voltage level at the second data storage node. Operated in this way, the memory element can successfully recover from random SEU events.

The memory element can be formed using a two-gate configuration or a four-gate configuration (as examples). In the two-gate configuration, the stacked pull-up transistors in each inverting circuit share the same gate structure and are coupled in series. In the four-gate configuration, the stacked pull-up transistors in each inverting circuit share a common source-drain region, whereas the pull-down transistors share a common source region configured to receive a ground power supply voltage.

Further features of the present invention, its nature and various advantages will be more apparent from the accompanying drawings and the following detailed description.

DETAILED DESCRIPTION

This relates to integrated circuit memory elements that exhibit improved read/write margins and that are resistant to soft error upset events. The memory elements, which are sometimes referred to as cells, may contain any suitable number of transistors. The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
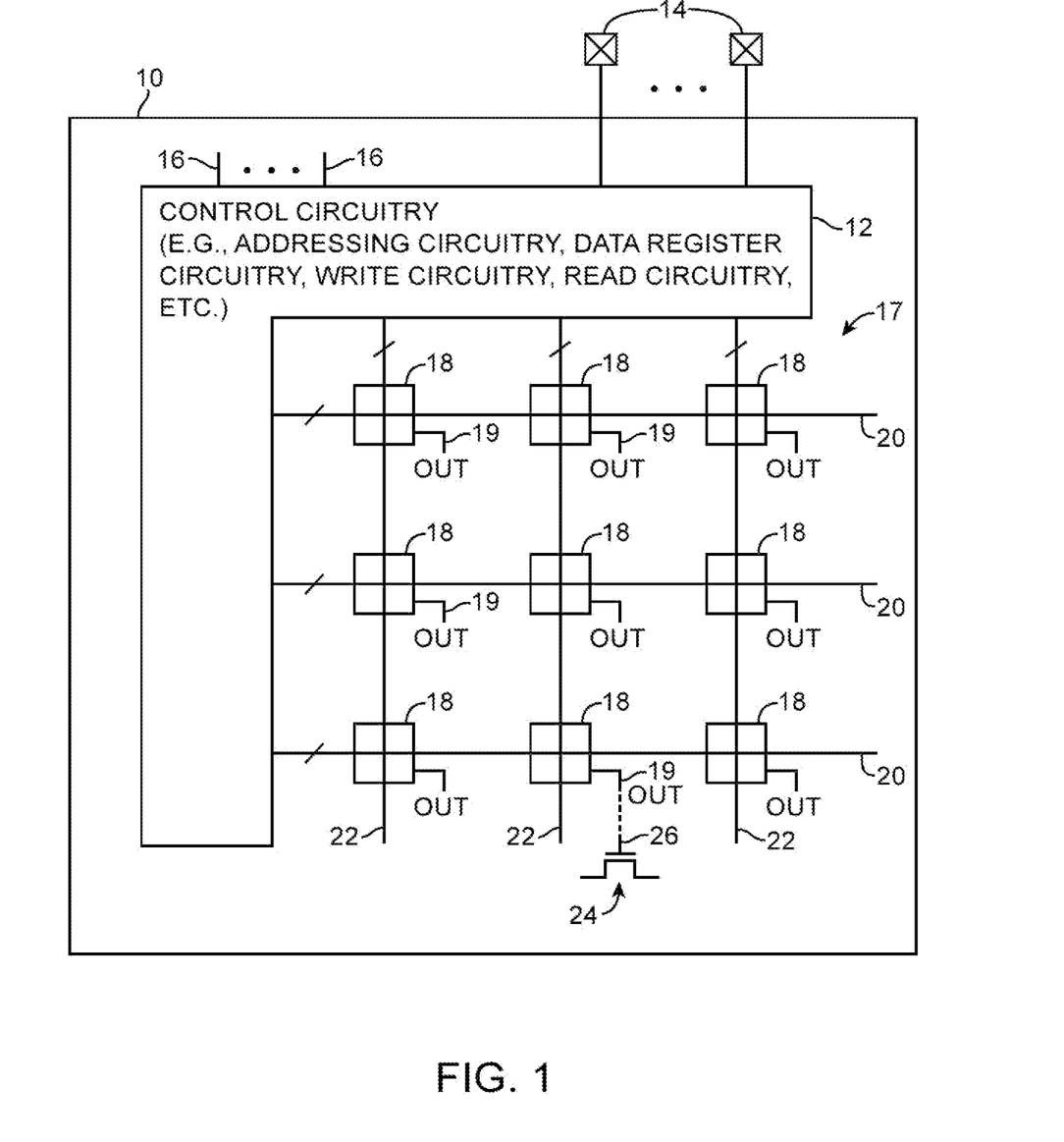
FIG. 1 is a diagram of an illustrative memory element array in accordance with an embodiment of the present invention.

FIG. 1 shows an integrated circuit that may include an array of memory elements (cells) 18. Any suitable memory array architecture may be used for memory cells 18. One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18.

Each memory element 18 may be formed from a number of transistors configured to form a bistable circuit (i.e., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.). Arrangements with bistable elements formed from cross-coupled inverting pairs are sometimes described herein as an example. This is, however, merely illustrative. Memory elements 18 may be formed using any suitable memory cell architecture.

Each memory element may supply a corresponding output signal OUT at a corresponding output path 19. In CRAM arrays, each signal OUT is a static output control signal that may be conveyed over a corresponding path 26 and may be used in configuring a corresponding transistor such as transistor 24 or other circuit element in an associated programmable logic circuit.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by pins 14 to produce desired time-varying and fixed signals on paths such as paths 20 and 22.

There may, in general, be any suitable number of conductive lines associated with paths 20 and 22. For example, each row of array 17 may have associated address lines (e.g., a true address line and a complement address line) and associated read/write enable lines in a respective one of paths 20 (as examples). Each column of array 17 may have a respective path 20 that includes data lines (e.g., a true data line and a complement data line). A clear signal may be routed to all of the cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each cell 18 using a pattern of shared horizontal or vertical conductors. A ground voltage Vss may likewise be supplied in parallel to cells 18 using a pattern of shared horizontal or vertical lines. Control lines such as address lines and data lines are typically orthogonal to each other (e.g., address lines are vertical while data lines are horizontal or vice versa).

The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, clear signals, data signals, address signals, etc. These different signal types are not mutually exclusive. For example, a clear signal for array 17 may serve as a type of control (address) signal that can be used to clear array 17. This clear signal may also serve as a type of power signal by powering inverter-like circuitry in cells 18. Likewise, because clearing operations serve to place logic zeros in memory cells 18, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, 0.8 volts, less than 0.8 volts, or any other suitable voltage. Ground voltage Vss may be zero volts (as an example). In a typical arrangement, power supply voltages Vcc may be 1.0 volts, Vss may be zero volts, and the signal levels for address, data, and clear signals may range from zero volts (when low) to 1.0 volts (when high). Arrangements in which Vcc varies as a function of time, in which Vss is less than zero volts, and in which control signals are overdriven (i.e., in which control signals have signal strengths larger than Vcc-Vss) may also be used.

Figure 2:
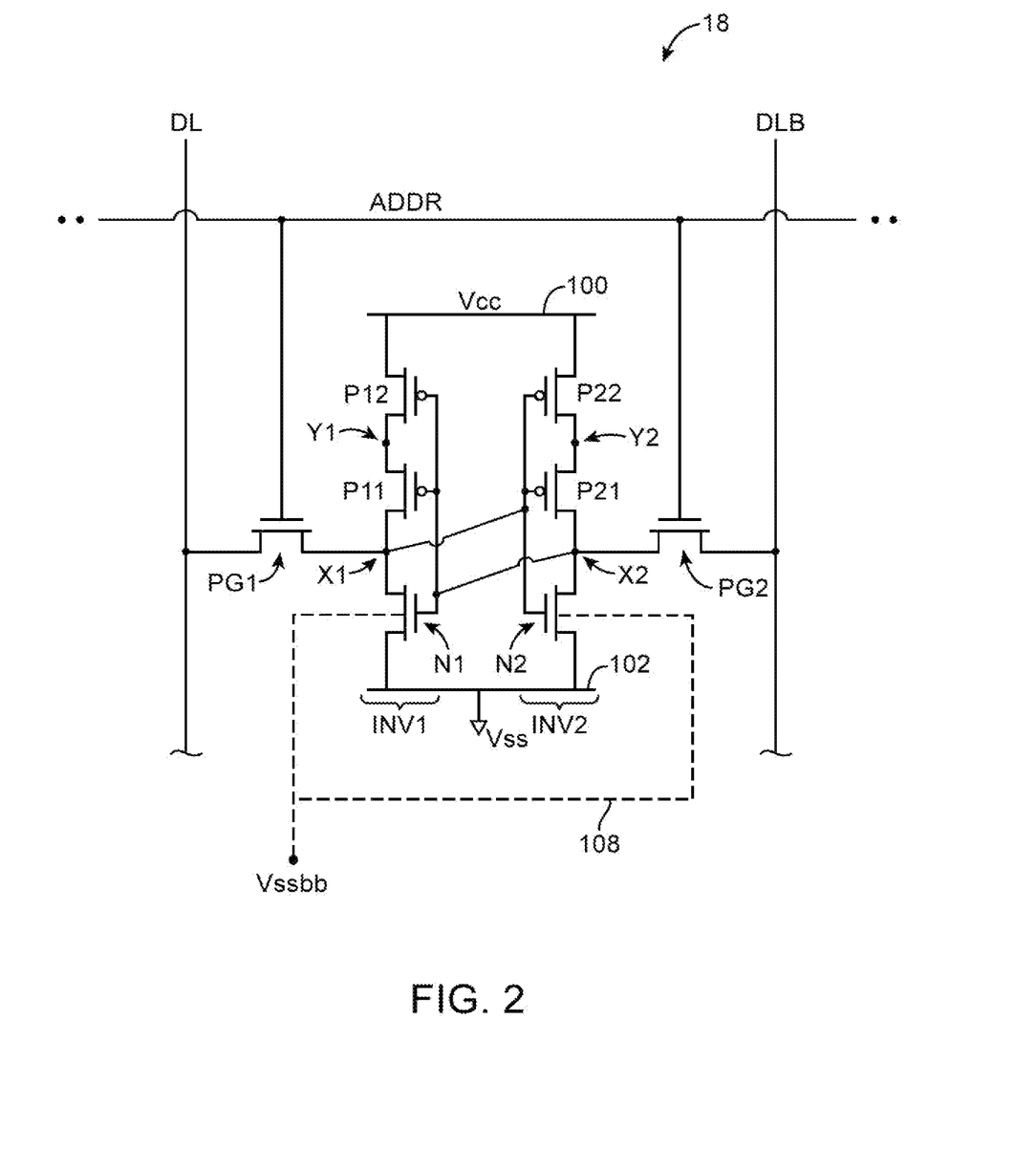
FIG. 2 is a diagram of an illustrative memory cell with stacked pull-up transistors in accordance with an embodiment of the present invention.

FIG. 2 is a circuit diagram showing one suitable arrangement of memory cell 18 with improved noise margin and immunity to soft error upsets. Improved cell performance may be provided via further weakening of cell pull-up drive strength by stacking transistors in the pull-up current path.

As shown in FIG. 2, the storage portion of cell 18 may include cross-coupled inverting circuits such as circuits INV1 and INV2 each of which has an input and an output. In particular, the input of circuit INV1 may be coupled to the output of circuit INV2, whereas the input of INV2 may be coupled to the output of circuit INV1. The output of circuit INV1 may serve as a first internal data storage node X1 for cell 18 while the output of circuit INV2 may serve as a second internal data storage node X2 for cell 18. The storage portion of cell 18 configured in this way may be used to store a single bit of data (e.g., data storage nodes X1 and X2 may store true and complement versions of a single data bit, respectively). As an example, cell 18 that is storing a high data bit may have data storage nodes X1 and X2 respectively driven to "0" and "1." As another example, cell 18 that is storing a low data bit may have data storage nodes X1 and X2 respectively driven to "1" and "0."

Circuit INV1 may include an n-channel transistor N1 and p-channel transistors P11 and P12 coupled in series between a positive power supply line 100 (e.g., a power supply line on which positive power supply voltage Vcc is provided) and a ground power supply line 102 (e.g., a power supply line on which ground power supply voltage Vss is provided). In particular, transistor N1 may have a first source-drain terminal that is coupled to first data storage node X1, a second source-drain terminal that is coupled to ground power supply line 102, and a gate terminal that is shorted to the input of circuit INV1. Transistors P11 and P12 may be coupled in series between positive power supply line 100 and first data storage node X1 via their source-train terminals (e.g., via an intermediate series connection node Y1) and may have gates that are shorted to the input of circuit INV1.

Similarly, circuit INV2 may include an n-channel transistor N2 and p-channel transistors P21 and P22 coupled in series between power supply lines 100 and 102. In particular, transistor N2 may have a first source-drain terminal that is coupled to second data storage node X2, a second source-drain terminal that is coupled to ground power supply line 102, and a gate terminal that is shorted to the input of circuit INV2. Transistors P21 and P22 may be coupled in series between positive power supply line 100 and second data storage node X2 via their source-train terminals (e.g., via an intermediate series connection node Y2) and may have gates that are shorted to the input of circuit INV2.

N-channel transistor N1 and N2 in the pull-down current path may sometimes be referred to as memory pull-down devices, whereas p-channel transistors P11, P12, P21, and P22 in the pull-up current path may sometimes be referred to as memory pull-up devices. Coupling p-channel transistors in series in the pull-up current path may be referred to as "stacking" pull-up transistors (e.g., transistors P11 and P12 may be referred to collectively as a first group of stacked pull-up transistors, whereas transistors P21 and P22 may be referred to collectively as a second group of stacked pull-up transistors). The n-channel transistors may be n-channel metal-oxide-semiconductor (NMOS) devices, whereas the p-channel transistors may be p-channel metal-oxide-semiconductor (PMOS) devices (as an example). If desired, more than two p-channel transistors may be stacked in the pull-up current path in the storage portion of memory cell 18. If desired, more than two inverting circuit each of which has stacked pull-up transistors may be used in memory cell 18 (e.g., memory cell 18 may be formed from at least three cross-coupled inverting circuits, at least four cross-coupled inverting circuits, at least five cross-coupled inverting circuits, etc.).

As shown in FIG. 2, each n-channel transistor in the storage portion of memory cell 18 may have a body terminal that is coupled to line 108. Line 108 may be driven to body biasing voltage Vssbb (e.g., line 108 may be controlled by a biasing signal). Placing the pull-down transistors (i.e., transistors N1 and N2) in reverse body bias may in general reduce the leakage currents flowing through these transistors (e.g., by driving body biasing voltage Vssbb to −0.2 V, −0.3 V, etc.). The pull-up transistors (i.e., transistors P11, P12, P21, and P22) may have body terminals that are coupled to their source terminals or to positive power supply line 100. If desired, the pull-up transistors may be supplied with forward body bias or reverse body bias as needed to reduce leakage or optimize performance.

The storage portion of memory cell 18 may be coupled to access transistors (sometimes referred to as memory address transistors or memory "pass gate" transistors) such as transistors PG1 and PG2 to perform read and write operations. In the example of FIG. 2, access transistor PG1 may be coupled between a first data line (e.g., a true data line on which true data signal DL is conveyed) and first data storage node X1, whereas access transistor PG2 may be coupled between a second data line (e.g., a complementary data line on which complement data signal DLB is conveyed) and second data storage node X2. Transistors PG1 and PG2 may each have a gate that is coupled to an address line on which address signal ADDR is conveyed.

During normal operation, the true and complementary data lines may be nominally driven to zero volts to minimize leakage currents, whereas address signal ADDR may be deasserted (e.g., address signal ADDR may be pulled low to disable access transistors PG1 and PG2). For example, address signal ADDR may be driven to −0.1 V to reduce leakage currents through access transistors PG1 and PG2. If desired, address signal ADDR may be driven to −0.2 V or other negative voltages to further reduce leakage through the access transistors.

During write operations, desired data signals may be presented on the first and second data lines. Address signal ADDR may then be asserted to enable access transistors PG1 and PG2 to write in a desired value into memory cell 18. As an example, data line signals DL and DLB may be respectively driven to logic "0" and "1" to load a high data bit into memory cell 18 using the activated pass gates PG1 and PG2. As another example, data line signals DL and DLB may be respectively driven to logic "1" and "0" to load a low data bit into memory cell 18 using the activated pass gates PG1 and PG2.

During read operations, the first and second data lines are precharged to a high voltage level. Address signal ADDR may then be asserted to enable access transistors PG1 and PG2 to read out a currently stored value in memory cell 18. If cell 18 is storing a logic "1" (i.e., node X2 is storing a "1"), the first data line will discharge towards zero volts through transistors PG1 and N1 while the second data line will remained charged at the high voltage level. If cell 18 is storing a "0" (i.e., if node X2 is storing a "0"), the first data line will remain charged at the high voltage level while the second data line will discharge towards zero volts through transistors PG2 and N2. Other read circuitry such as sense amplifier circuitry (not shown) may be used to sense the voltage difference between the first and second data lines and may be used to determine whether cell 18 is currently storing a "1" or "0" based on the polarity of the voltage difference (e.g., by determining which one of the first and second data lines has discharged towards ground).

The read performance of memory cell 18 may be characterized by a metric commonly referred to as read noise margin or static noise margin (SNM), whereas the write performance of memory cell 18 may be characterized by another metric commonly referred to as write noise margin (WNM). Static noise margin may be dependent on the relative drive strength between the pass gates (e.g., access transistors PG1 and PG2) and the pull-down transistors (e.g., transistors N1 and N2). In particular, it may be desirable minimize the ratio of pass gate drive strength to pull-down drive strength so as to optimize static noise margin (e.g., it may be desirable to increase the drive-ability of the pull-down transistors relative to that of the pass gates to ensure that data does not inadvertently flip during read operations).

On the other hand, write noise margin may be dependent on the relative drive strength between the pass gates and the pull-up transistors (e.g., transistors P11, P12, P21, and P22). In particular, it may be desirable to maximize the ratio of pass gate drive strength to pull-up drive strength so as to optimize write noise margin (e.g., it may be desirable to decrease the drive-ability of the pull-up transistors relative to that of the pass gates to ensure that new data can be properly loaded into cell 18 during write operations).

Generally, there is a tradeoff between static noise margin and write noise margin. In other words, an increase in read margin comes at the cost of reduced write margin while an increase in write margin comes at the cost of degraded read margin. A conventional six-transistor (6T) SRAM cell includes two cross-coupled inverters each of which has a single non-stacked PMOS transistor in the pull-up current path. The non-stacked PMOS transistors are formed using the minimum gate length and the minimum channel width as allowed by the current CMOS manufacturing technology. It is desirable to form the pull-up transistor as weak (or small) as possible so that the access transistors can be sized accordingly to satisfy required write margins and so that the pull-down transistors can then be sized appropriately to satisfy the target read margins.

Figure 3:
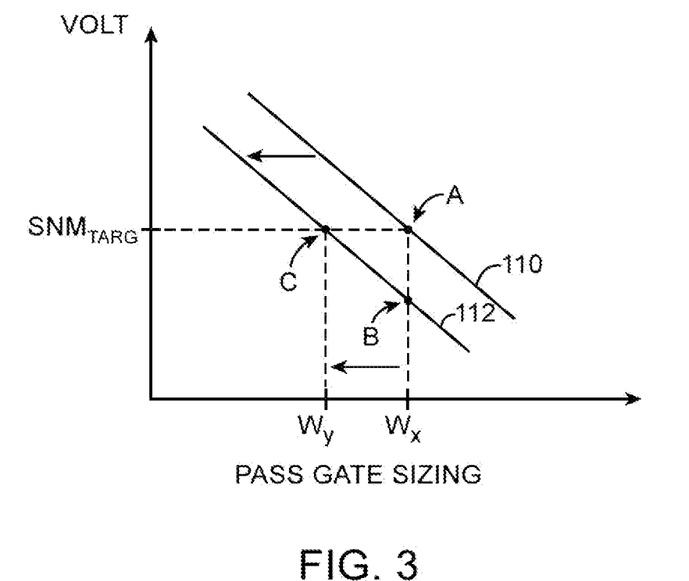
FIG. 3 is a plot of static (read) noise margin versus pass gate sizing in accordance with an embodiment of the present invention.

In accordance with an embodiment of the present invention, stacking more than one pull-up transistor in series can further weaken the pull-up current path (e.g., by stacking p-channel transistors P11 and P12 in series and by stacking p-channel transistors P21 and P22 in series). FIG. 3 shows a plot of read static noise margin versus pass gate sizing (e.g., the width of pass gate transistor PG1 and PG2). Characteristic line 110 plots SNM as a function of pass gate sizing for a conventional 6T memory cell, whereas characteristic line 112 plots SNM as a function of pass gate sizing for an illustrative memory cell 18 with stacked pull-up transistors.

A shown in FIG. 3, the conventional 6T cell may limit the maximum allowed pass gate sizing to a device width Wx in order to still satisfy target read margin $SNM_{TARG}$ (as indicated by point A on line 110). Stacking transistors in the pull-up current path in memory cell 18 shifts the relationship left to line 112. If the pass gate sizing were to stay fixed at Wx, the resulting read margin would be less than $SNM_{TARG}$ (as indicated by point B on line 112). Thus, in order for read margin to still satisfy $SNM_{TARG}$, pass gate sizing would have to be decreased to Wy (as indicated by point C on line 112).

Figure 4:
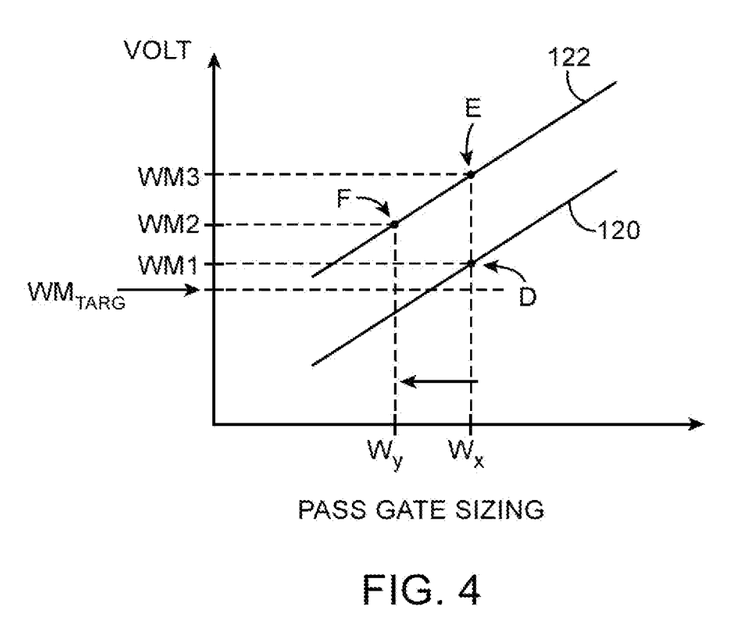
FIG. 4 is a plot of write noise margin versus pass gate sizing in accordance with an embodiment of the present invention.

FIG. 4 shows a plot of write margin versus pass gate sizing. Characteristic line 120 plots write margin as a function of pass gate sizing for the conventional 6T memory cell, whereas characteristic line 122 plots write margin as a function of pass gate sizing for illustrative memory cell 18 with stacked p-channel transistors. As shown in FIG. 4, the conventional 6T cell with the conventional pass gate sizing of Wx may have a write margin of WM1 that is greater than target write margin $WM_{TARG}$ (as indicated by point D on line 120).

Stacking transistors in the pull-up current path in memory cell 18 shifts the relationship left to line 122. As described in connection with FIG. 3, pass gate sizing has to be decreased from Wx to Wy due to read margin constraints, which causes write margin to decrease from WM3 to WM2 (as indicated by the shift from point E to point F on line 122). Fortunately, WM2 is still above WM_TARG even though pass gate sizing has been reduced. This ability to still satisfy write performance criteria even after reducing pass gate sizing is also a result of the weakened pull-up current path. In other words, the weakening of the pull-up current path as a result of the stacked pull-up transistors allows the pass gate sizing to be reduced while maintaining write margin, improving read margin, and reducing the memory cell area.

Figure 5:
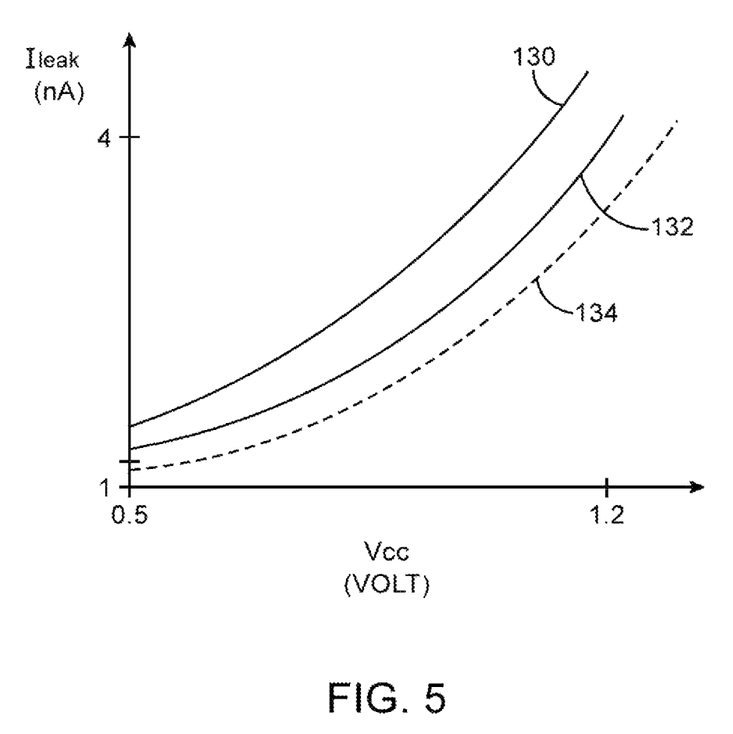
FIG. 5 is a plot of cell leakage versus power supply voltage level in accordance with an embodiment of the present invention.

FIG. 5 is a diagram showing the amount of leakage (Ileak) in the storage portion of cell 18 as a function of power supply voltage Vcc. Characteristic curve 130 represents the leakage profile for the conventional 6T memory cell, whereas characteristic curve 132 represents the leakage profile for memory cell 18 having stacked pull-up transistors. As shown in FIG. 5, memory cell 18 having stacked pull-up transistors exhibits reduced leakage for all levels of Vcc. The amount of leakage can be further reduced by reverse biasing n-channel pull-down transistors N1 and N2 (e.g., by applying a negative voltage to Vssbb), as indicated by characteristic curve 134.

Figure 6:
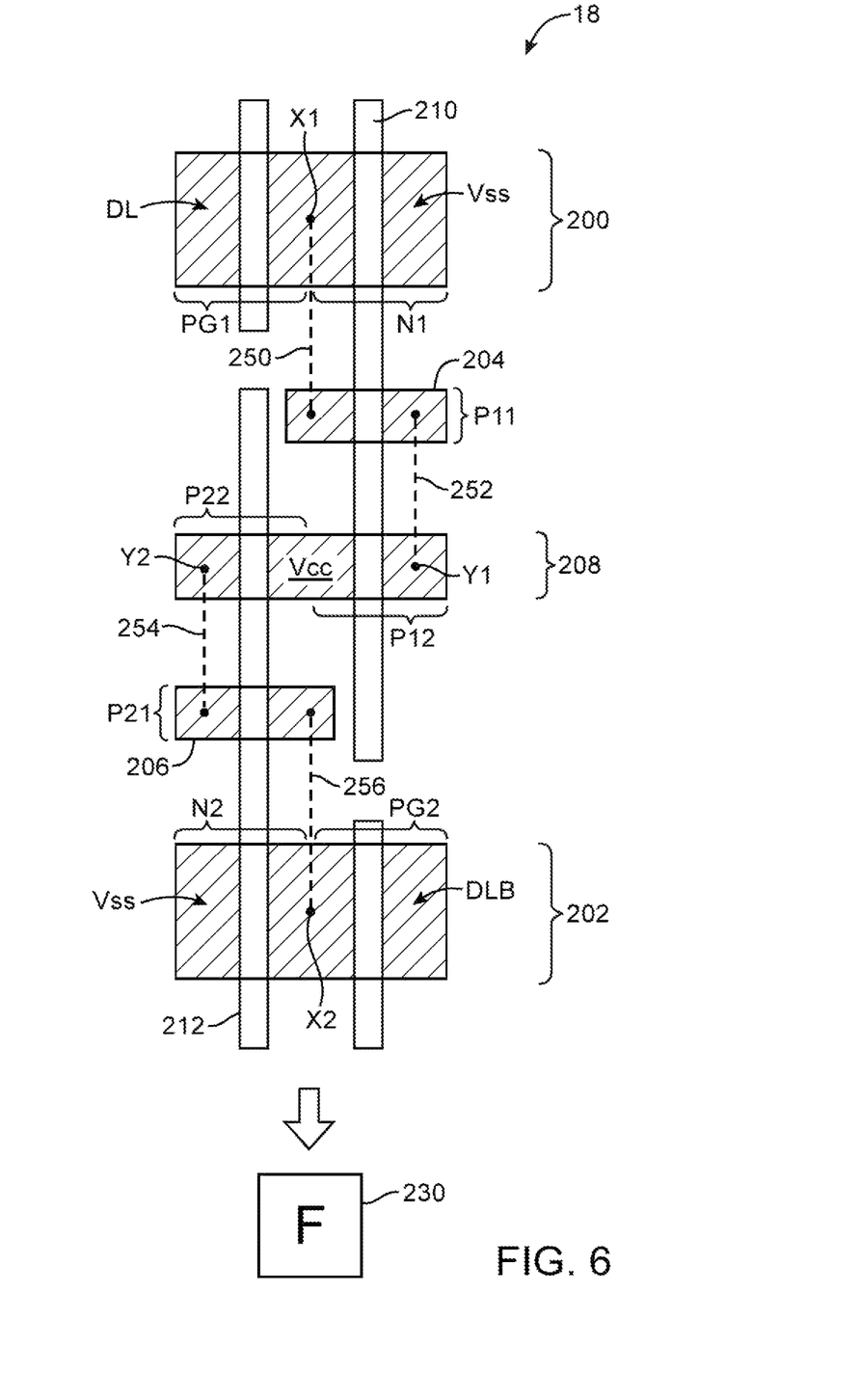
FIG. 6 is a top layout view of an illustrative memory cell implemented using a two-gate configuration in accordance with an embodiment of the present invention.

FIG. 6 is a top layout view of one suitable arrangement in which memory cell 18 can be formed on integrated circuit 10. As shown in FIG. 6, transistors PG1 and N1 may be formed over n+ diffusion regions 200; transistors PG2 and N2 may be formed over n+ diffusion regions 202; transistor P11 may be formed over p+ diffusion regions 204; transistor P21 may be formed over p+ diffusion regions 206; and transistors P12 and P22 may be formed over p+ diffusion regions 208. These diffusion regions (i.e., the shaded regions in FIG. 6) are sometimes referred to as oxide definition (OD) regions and are used to serve as source-drain regions for each of the associated transistors.

In particular, transistor PG1 may have a first source-drain region that receives data line signal DL and a second source-drain region that is coupled to first data storage node X1, whereas transistor PG2 may have a first source-drain region that receives data line signal DLB and a second source-drain region that is coupled to second data storage node X2. Transistor N1 may have a source region that receives ground power supply signal Vss and a drain region that is coupled to node X1 (e.g., transistors PG1 and N1 may share a common source-drain region 200), whereas transistor N2 may have a source region that receives Vss and a drain region that is coupled to node X2 (e.g., transistors PG2 and N2 may share a common source-drain region 202).

Transistor P11 has a drain region that is coupled to node X1 via conductive path 250 and has a source region. Similarly, transistor P21 has a drain region that is coupled to node X2 via conductive path 256 and has a source region. Transistor P12 has a source region that receives positive power supply voltage Vcc and a drain region (i.e., intermediate stacking node Y1) that is coupled to the source region of transistor P11 via conductive path 252, whereas transistor P22 has a source region that receives Vcc and a drain region (i.e., intermediate stacking node Y2) that is coupled to the source region of transistor P21 via conductive path 254. Transistors P12 and P22 may share a common source-drain region 208 that receives Vcc.

Transistor N1, P11, and P12 may share a common gate structure 210. Transistors N2, P21, and P22 may also share a common gate structure 212. Transistor PG1 may have a gate structure that is parallel and aligned with gate structure 212, whereas transistor PG2 may have a gate structure that is parallel and aligned with gate structure 210. These gate structures may be formed from polysilicon, metal, or other suitable conductive material. The arrangement of cell 18 as shown in FIG. 6 in which cell 18 has no more than two parallel gate lines along its width is sometimes referred to as a two-gate configuration. Cell 18 implemented using the two-gate configuration may be represented using block 230 (as an example).

Figure 7:
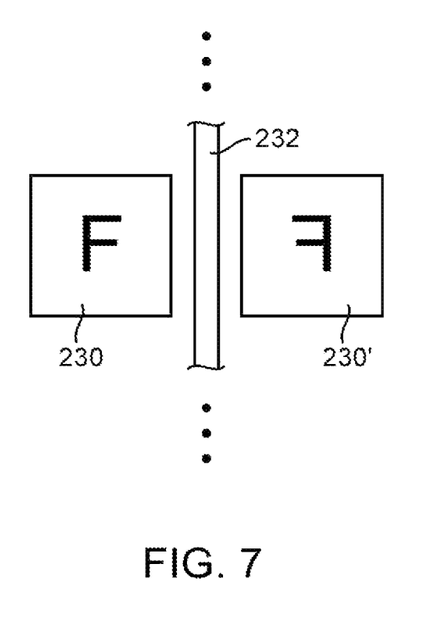
FIG. 7 is a diagram showing how adjacent memory cells of the type shown in FIG. 6 can be mirrored in accordance with an embodiment of the present invention.

In the example of FIG. 6, internal cell nodes Y1 and Y2 are located at the periphery of cell 18. As a result, adjacent mirrored cells 18 cannot be overlapped and may need to be separated by an additional dummy gate structure 232 (as shown in FIG. 7 in which dummy gate 232 is interposed between a first memory block 230 and a second mirrored memory block 230'). The need for an additional dummy gate structure 232 increases cell area.

Figure 8:
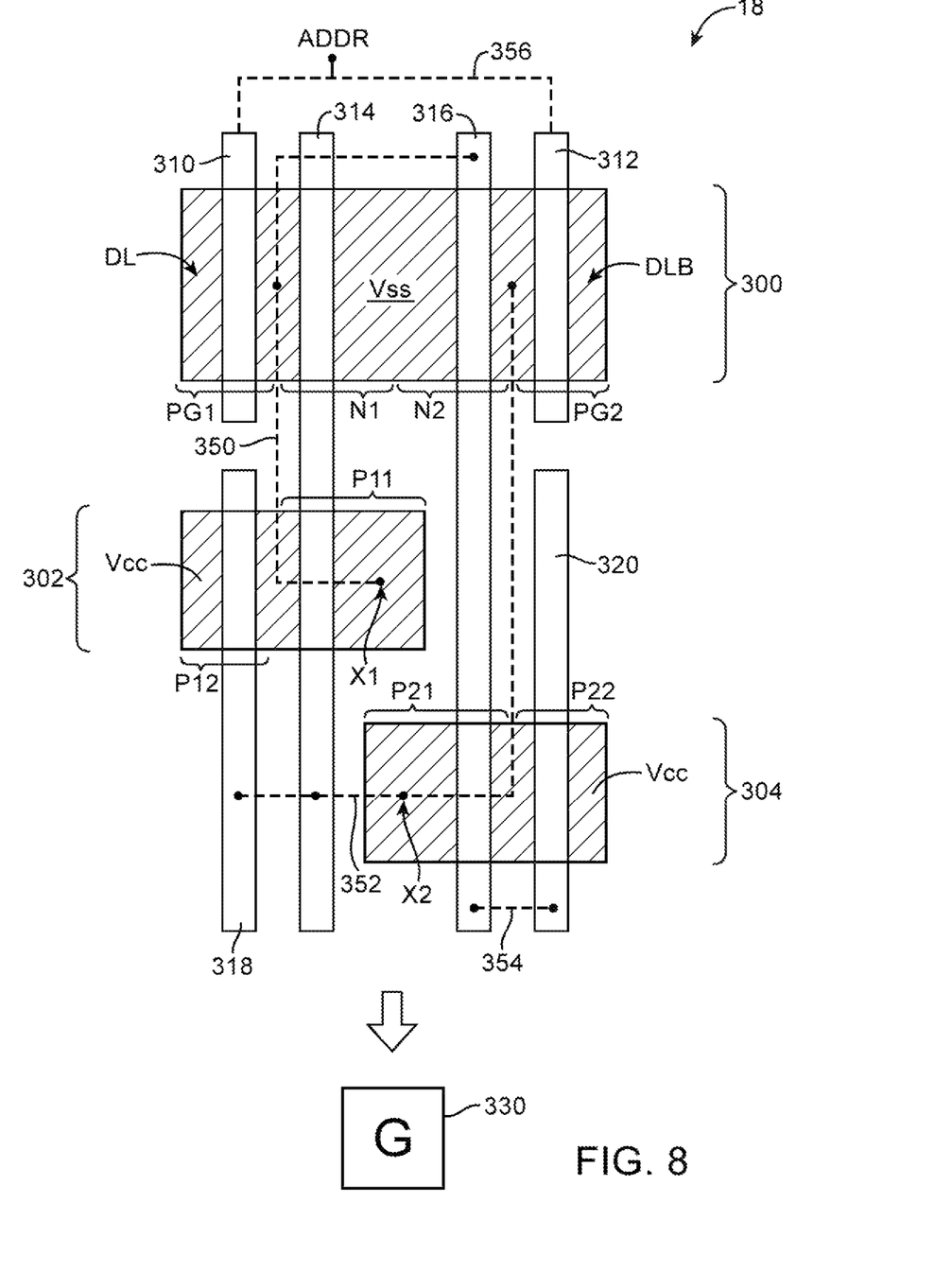
FIG. 8 is a top layout view of an illustrative memory cell implemented using a four-gate configuration in accordance with an embodiment of the present invention.

FIG. 7 is a top layout view of another suitable arrangement in which memory cell 18 can be formed on integrated circuit 10. As shown in FIG. 7, transistors PG1, PG2, N1, and N2 may be formed over n+ diffusion regions 300; transistors P11 and P12 may be formed over p+ diffusion regions 302; and transistors P21 and P22 may be formed over p+ diffusion regions 304. The diffusion regions are shown as shaded regions in FIG. 8.

In particular, transistor PG1 may have a first source-drain region that receives data line signal DL and a second source-drain region that is coupled to first data storage node X1, whereas transistor PG2 may have a first source-drain region that receives data line signal DLB and a second source-drain region that is coupled to second data storage node X2. Transistor N1 may have a source region that receives ground power supply signal Vss and a drain region that is coupled to node X1 (e.g., transistors N1 and PG1 may share a common source-drain region 300), whereas transistor N2 may have a source region that receives Vss and a drain region that is coupled to node X2 (e.g., transistors N2 and PG2 may share a common source-drain region 300). Transistors N1 and N2 may also share a common source-drain region 300 that receives Vss.

Transistor P11 has a drain region that is coupled to node X1 via conductive path 350 and has a source region. Similarly, transistor P21 has a drain region that is coupled to node X2 via conductive path 352 and has a source region. Transistor P12 has a source region that receives positive power supply voltage Vcc and a drain region that is shared with the source region of transistor P11, whereas transistor P22 has a source region that receives Vcc and a drain region that is shared with the source region of transistor P21.

Transistor N1 and P11 may share a common gate structure 314. Transistors N2 and P21 may also share a common gate structure 316. Transistor PG1 may have a gate structure 310 that is parallel and aligned with gate structure 318 of transistor P12, whereas transistor PG2 may have a gate structure 312 that is parallel and aligned with gate structure 320 of transistor P22. In particular, gate structures 318 and 314 may be shorted to node X2 via conductive path 352. Similarly, gate structures 320 and 316 may be shorted to node X1 via conductive paths 354 and 350. Gate structures 310 and 312 of pass gate transistors PG1 and PG2 may receive address signal ADDR via address line conductor 356.

Figure 9:
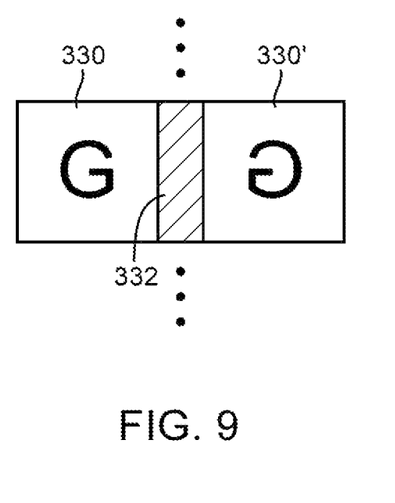
FIG. 9 is a diagram showing how adjacent memory cells of the type shown in FIG. 8 can be mirrored in accordance with an embodiment of the present invention.

The arrangement of cell 18 as shown in FIG. 7 in which cell 18 has no more than four parallel gate lines along its width is sometimes referred to as a four-gate configuration. Cell 18 implemented using the four-gate configuration may be represented using block 330 (as an example). In the example of FIG. 7, source-drain regions presented at the periphery of cell 18 represent terminals such as data line terminals and power supply terminals that can be shared among adjacent cells. As a result, adjacent mirrored cells 18 can be overlapped (as shown in FIG. 9 in which a first memory block 330 and a second mirrored memory block 330' has an overlapping region 332). Overlapping adjacent memory cells 18 in this way can help reduce memory cell area.

In conventional 6T memory cell designs (i.e., designs based on generic cross-coupled inverters), there is a relatively strong likelihood that a radiation strike on an inverter's input node will cause the inverter's output to change states, thereby flipping the state of the cell to an erroneous value. In the arrangement of FIG. 2, the weakened pull-up drive strength of memory cell 18 helps facilitate recovery from a radiation strike on a particular node without flipping its state (e.g., cell 18 exhibits good immunity to radiation-induced upset events).

During normal memory operation, each cell 18 in array 17 may be used to store a desired data bit. In this mode of operation, the address signals ADDR are deasserted so that the pass gate transistors are disabled. With the pass gate transistors off, the data line will be isolated from the storage portion of cell 18 (i.e., transistors N1, N2, P11, P12, P21, and P22).

Figure 10:
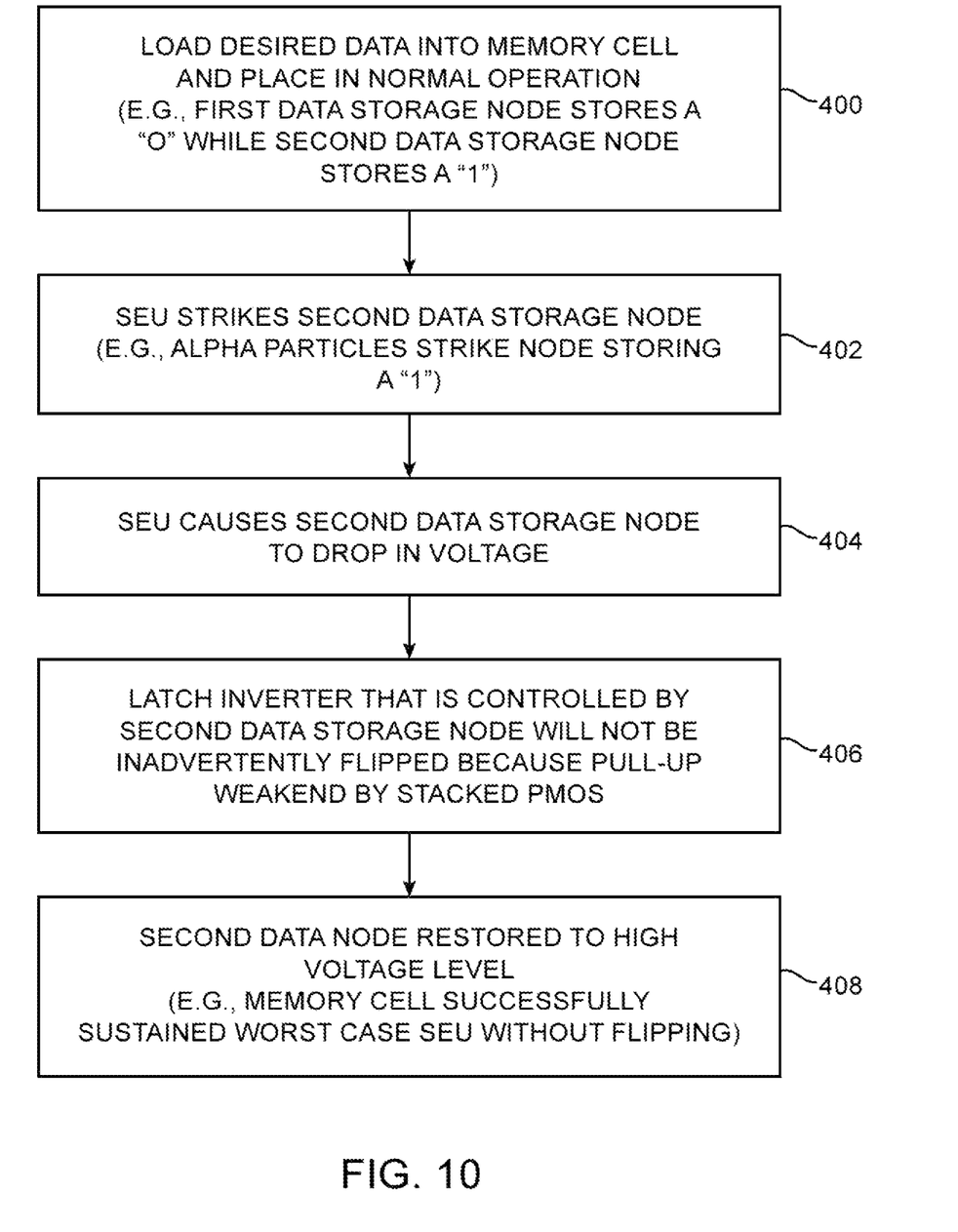
FIG. 10 is a flow chart of illustrative steps showing how a memory cell with stacked pull-up transistors may be operated to exhibit soft error upset immunity in accordance with an embodiment of the present invention.

FIG. 10 is a flow chart showing how memory cell 18 may be operated in response to a radiation strike (i.e., a event sometimes referred to as a soft error upset or "SEU"). At step 400, desired data may be loaded into memory cell 18. Once the desired data has been loaded into cell 18, cell 18 may be placed in normal operation to hold the stored data. Consider, as an example, a scenario in which first data storage node X1 stores a logic "0" and second data storage node X2 stores a logic "1").

If radiation strikes second data storage node X2 (e.g., the node current storing a high data bit), radiation-induced charge on node X2 may cause the voltage on node X2 to drop in voltage (see, 402 and 404 in FIG. 10). When the voltage on node X2 drops to an intermediate voltage level, the inverting circuit that is controlled by node X2 (i.e., circuit INV1) will not be inadvertently flipped because the pull-up has been weakened by the stacked p-channel transistors (step 406). In other words, the series-connected pull-up transistors are too weak to pull up data storage node X1 in contention with transistor N1 even if node X2 has fallen to some intermediate voltage level.

Memory cell 18 will eventually recover to its intended state by restoring data node X2 to Vcc (step 408). In this scenario, memory cell 18 has successfully sustained a worst case SEU event without inadvertently being flipped.

As this example demonstrates, the architecture of cell 18 allows the cell to retain its stored data value (a stored "1" in this example) even when a node in the cell is struck by radiation. The immunity of cell 18 to undesired changes in state from radiation strikes helps to ensure that array 17 will exhibit stable operation in a variety of circumstances. More than two stacked p-channel memory transistors may be used to further weaken the pull-up drive strength of the storage portion of cell 18, if desired.

The foregoing is merely illustrative of the principles of this invention and various modifications can be made by those skilled in the art without departing from the scope and spirit of the invention. The foregoing embodiments may be implemented individually or in any combination.

What is claimed is:
1. An integrated circuit, comprising:
  a data line;
  a plurality of bistable memory elements, wherein each bistable memory element in the plurality of bistable memory elements is coupled to the data line and includes at least one inverting circuit having a plurality of stacked pull-up transistors, wherein the stacked pull-up transistors in the at least one inverting circuit have gate terminals that are shorted to one another; and a dummy gate conductor that is interposed between two adjacent bistable memory elements in the plurality of bistable memory elements and that is electrically floating.

2. The integrated circuit defined in claim 1, wherein each of the bistable memory elements further comprises:

an additional inverting circuit having a plurality of stacked pull-up transistors, wherein the stacked pull-up transistors in the additional inverting circuit have gate terminals that are shorted to one another.

3. The integrated circuit defined in claim 1, wherein the plurality of stacked pull-up transistors comprises a plurality of p-channel transistors.

4. The integrated circuit defined in claim 1, wherein the plurality of stacked pull-up transistors comprises a plurality of series-connected p-channel transistors.

5. The integrated circuit defined in claim 1, wherein the at least one inverting circuit further comprises:

a pull-down transistor coupled in series with the plurality of stacked pull-up transistors.

6. The integrated circuit defined in claim 5, wherein the pull-down transistor comprises a n-channel transistor.

7. The integrated circuit defined in claim 5, further comprising:

a first power supply line; and a second power supply line, wherein the pull-down transistor and the plurality of stacked pull-up transistors are coupled in series between the first and second power supply lines.

8. The integrated circuit defined in claim 5, wherein the pull-down transistor has a gate terminal that is shorted to the gate terminals of the stacked pull-up transistors.

9. The integrated circuit defined in claim 8, further comprising:

a control line, wherein the pull-down transistor has a body terminal that is coupled to the control line.

10. The integrated circuit defined in claim 9, wherein the pull-down transistor is configured to receive a voltage from the control line that reduces leakage current through the at least one inverting circuit by reverse biasing the body terminal.

11. A memory cell, comprising:

a first inverting circuit; and a second inverting circuit that is coupled to the first inverting circuit, wherein the first inverting circuit includes at least first and second pull-up transistors coupled in series, wherein the first inverting circuit has an output on which a static control signal is provided to a corresponding pass transistor, and wherein the second pull-up transistor has a source diffusion region and a drain diffusion region that are not shared with any other transistor in the memory cell.

12. The memory cell defined in claim 11, wherein the second inverting circuit includes at least two pull-up transistors coupled in series.

13. The memory cell defined in claim 11, wherein the at least first and second pull-up transistors comprises p-channel transistors.

14. The memory cell defined in claim 11, wherein the first inverting circuit further includes a pull-down transistor that is coupled in series with the at least first and second pull-up transistors, and wherein only the pull-down transistor receives a reverse body biasing voltage.

15. The memory cell defined in claim 14, wherein the at least first and second pull-up transistor and the pull-down transistor in the first inverting circuit have gate terminals that are shorted together.

16. A memory element, comprising:

a first inverting circuit; a second inverting circuit that is cross-coupled to the first inverting circuit; and an access transistor coupled to the first and second inverting circuits, wherein the access transistor is selectively activated to read data from the memory element, and wherein the first inverting circuit comprises:

a first pull-up transistor having a first conductive gate structure;

a second pull-up transistor having a second conductive gate structure that is separate from the first conductive gate structure and that is parallel to the first conductive gate structure; and only one pull-down transistor that is coupled in series with the first and second pull-up transistors.

17. The memory element defined in claim 16, wherein the first and second pull-up transistors shared a common source-drain region.

18. The memory element defined in claim 16, wherein the first and second conductive gate structures are shorted together.

19. The memory element defined in claim 16, wherein the first pull-up transistor has source-drain regions that are not shared by any other transistor in the memory element.

* * * * *